United States Patent [19]

Noguchi et al.

[11] Patent Number: 4,693,759
[45] Date of Patent: Sep. 15, 1987

[54] METHOD OF FORMING A THIN SEMICONDUCTOR FILM

[75] Inventors: Takashi Noguchi; Hisao Hayashi; Takefumi Ohshima, all of Kanagawa, Japan

[73] Assignee: Sony Corporation, Tokyo, Japan

[21] Appl. No.: 801,319

[22] Filed: Nov. 25, 1985

[30] Foreign Application Priority Data

Nov. 26, 1984 [JP] Japan .................................. 59-249406
Nov. 30, 1984 [JP] Japan .................................. 59-252882

[51] Int. Cl.$^4$ ..................... H01L 21/20; H01L 21/263
[52] U.S. Cl. ............................. 437/24; 148/DIG. 61; 437/973
[58] Field of Search ......................... 148/1.5, 175, 187; 29/576 B, 571

[56] References Cited

U.S. PATENT DOCUMENTS

| | | | |
|---|---|---|---|
| 4,177,084 | 12/1979 | Lau et al. ............................. | 148/1.5 |
| 4,358,326 | 11/1982 | Doo ...................................... | 148/174 |
| 4,385,937 | 5/1983 | Ohmura ............................... | 148/1.5 |
| 4,421,576 | 12/1983 | Jolly .................................... | 148/175 |
| 4,463,492 | 8/1984 | Maeguchi ........................... | 29/576 B |
| 4,509,990 | 4/1985 | Vasudev ............................. | 148/1.5 |
| 4,543,133 | 9/1985 | Mukai ................................. | 148/1.5 |
| 4,584,028 | 4/1986 | Pankove et al. .................... | 148/1.5 |
| 4,588,447 | 5/1986 | Golecki .............................. | 148/DIG. 61 |

FOREIGN PATENT DOCUMENTS 56-18430 2/1981 Japan ......................... 148/DIG. 128

OTHER PUBLICATIONS

Pankove et al., Phys. Rev. Letts., 51 (1983) 2224.
Lau et al., Appl. Phys. Letts., 34 (1979) 76.

Primary Examiner—Upendra Roy
Attorney, Agent, or Firm—Hill, Van Santen, Steadman & Simpson

[57] ABSTRACT

A method of forming a thin semiconductor film has the steps of: forming a thin semiconductor film on a predetermined substrate; implanting predetermined ions in the thin semiconductor film to convert the thin semiconductor film to a thin amorphous semiconductor film; decreasing a thickness of the thin amorphous semiconductor film to a predetermined thickness; and annealing the thin amorphous semiconductor film to cause solid-phase growth. According to this method, a large thin polycrystalline semiconductor film with a crystal grain size larger than the conventional crystal grain size and a good crystal grain orientation can be uniformly formed at a low temperature. It is, therefore, possible to use such a thin semiconductor film to fabricate a thin film semiconductor device with excellent electrical characteristics.

5 Claims, 18 Drawing Figures

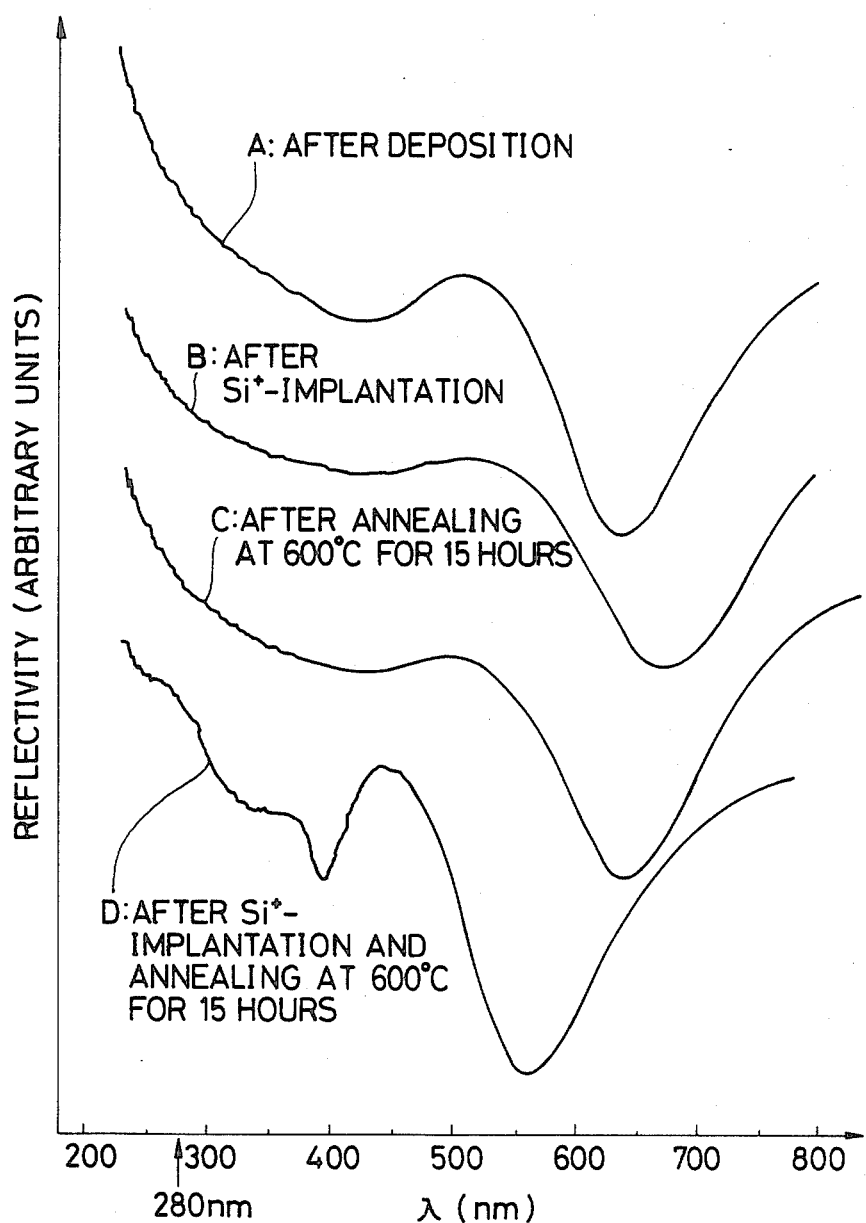

METHOD OF FORMING A THIN SEMICONDUCTOR FILM

BACKGROUND OF THE INVENTION

1. Field of the Invention

The present invention relates to a method of forming a thin semiconductor film and, more particularly, to a method suitable for forming a polysilicon film for a thin film transistor (TFT) on an insulating substrate.

2. Description of the Prior Art

Conventionally, a polysilicon film for a polysilicon thin film transistor (to be referred to as a polysilicon TFT hereinafter) is formed by the following method. A polysilicon film is formed on a substrate such as a quartz substrate by a low-pressure chemical vapor deposition method (LPCVD method) or an atmospheric pressure chemical vapor deposition method (APCVD method). Ions such as Si+ are implanted in the polysilicon film to convert the polysilicon film to an amorphous film, and annealing or thermal oxidation is performed to crystallize the amorphous film. With this method, crystal grains of the resultant polysilicon film are large. However, a TFT using this polysilicon film has a maximum electron mobility $\mu$ of about 100 cm$^2$/V·sec, which is insufficient for an application of silicon on insulator (SOI) (three-dimensional IC). When the thickness of a polysilicon film formed by the CVD method is less than 1,000 Å, the crystal grains are small and the trap density is large. Therefore, this polysilicon film has small electron mobility $\mu$ and lifetime $\tau$. Furthermore, the polysilicon film has an electric conductivity $\sigma \neq \sigma_0 \exp(-E_a/kT)$ (where $E_a$ is activation energy and T is absolute temperature) at room temperature and does not show an activation type conduction. The electric conductivity follows the rule of variable range hopping given by:

$$\sigma = \sigma_0 \exp(-AT^{-\frac{1}{4}})$$

As a result, the above-mentioned polysilicon film has poor electrical characteristics.

Laser annealing can also be used to form a polysilicon film. With this method, an amorphous silicon film is formed by deposition on a substrate and is irradiated with a laser beam to grow crystal grains. A polysilicon film formed by this method, however, has poor electrical characteristics. For example, when a film of this type is used to fabricate a TFT, leakage current is large. In addition, uniformity is difficult to obtain when forming a large polysilicon film with this method.

In order to achieve an SOI application with a higher electron mobility $\mu$, crystal grains of the polysilicon film must be enlarged, and their orientation must be improved. Furthermore, in order to simplify device design, the size and orientation of the crystal grains should be easily controllable, and at the same time planar uniformity of the film must be achieved. In spite of various attempts using a laser or other methods, polysilicon films with a sufficiently large crystal grain size and a good crystal grain orientation cannot be uniformly formed at present.

A prior-art TFT reference is exemplified in the 45th Lecture Articles of the Japan Society of Applied Physics (1984), Nos. 14p-A-4 to 14p-A-6, PP. 407–408. This reference describes an improvement in a polysilicon TFT having transistor characteristics improved by an ultra-thin polysilicon film, improvements in a solid-phase crystal grain growth effect and conduction characteristics of the ultra-thin polysilicon film obtained by thermal oxidation, and an improvement in transistor characteristics obtained by annealing a structure in a hydrogen atmosphere at a temperature of 400° C. after an Si$_3$N$_4$ film is formed by a plasma CVD method on the ultra-thin polysilicon TFT to obtain the structure.

OBJECT AND SUMMARY OF THE INVENTION

It is an object of the present invention to provide a method of forming a thin semiconductor film free from the conventional drawbacks described above.

The background for the present invention will be described hereinafter. According to C. V. Thompson & Henry I. Smith (MIT, Apl., 44, P603 (1984)), a radius $r_s$ (=d$_s$/2) of a secondary crystal grain grown by annealing is given as:

$$(r_s - r_n) \propto t/h$$

where $d_n$ is the diameter of a primary crystal grain shown in FIG. 1, h is the thickness thereof, and t is the annealing time. As is apparent from the relation described above, the growth of the secondary crystal grain is proportional to the annealing time t but is in inverse proportion to the thickness h. The secondary crystal grain growth is achieved by minimization of anisotropic surface energy. For example, ions such as Si+ are implanted in a polysilicon film to temporarily obtain an amorphous silicon film. The thickness of this amorphous silicon film is then decreased, and long-period annealing is performed to cause solid-phase growth, thereby forming primary crystal grains. Thereafter, secondary crystal grains are grown in accordance with the proportional relation described above.

The present invention has been achieved based on the above findings.

According to the present invention, there is provided a method of forming a thin semiconductor film, comprising the steps of: forming a thin semiconductor film on a predetermined substrate; implanting predetermined ions in the thin semiconductor film to convert the thin semiconductor film to a thin amorphous semiconductor film; decreasing the thickness of the thin amorphous semiconductor film to a predetermined thickness; and annealing the thin amorphous semiconductor film to cause solid-phase growth.

According to the method described above, a large thin polycrystalline semiconductor film with a crystal grain size larger than the conventional crystal grain size and a good crystal grain orientation can be uniformly formed at a low temperature. It is, therefore, possible to use such a thin semiconductor film in the fabrication of a thin film semiconductor device with excellent electrical characteristics.

BRIEF DESCRIPTION OF THE DRAWING

FIG. 4 is a graph showing reflection spectra of a hydrogenated amorphous silicon film after various treatments are performed in the second embodiment;

DETAILED DESCRIPTION OF THE PREFERRED EMBODIMENT

Preferred embodiments applying a method of forming a thin semiconductor film of the present invention to the fabrication of ultra-thin film polysilicon TFTs will be described with reference to the accompanying drawings.

A first embodiment of the present invention will be described.

Figure 1:
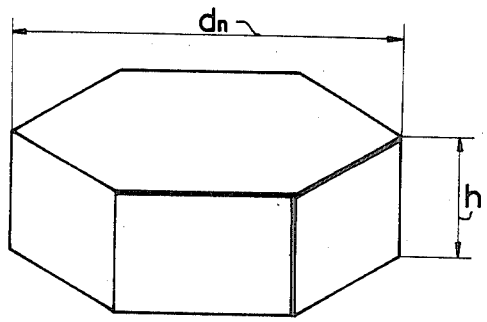
FIG. 1 is a perspective view of a primary crystal grain to explain growth from the primary crystal grain to a secondary crystal grain.
Figure 2A:
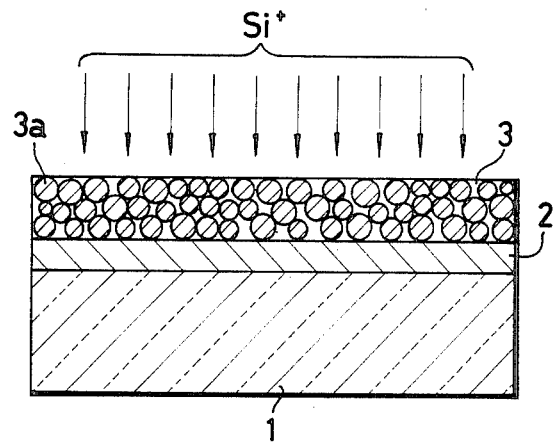
FIGS. 2A to 2H are sectional views for explaining the steps in manufacturing an ultra-thin film polysilicon TFT by a method of forming a thin semiconductor film according to a first embodiment of the present invention.

As shown in FIG. 2A, an $SiO_2$ film 2 is formed on a quartz substrate 1, and a polysilicon film 3 (crystal grains represented by 3a) having a thickness of, e.g., 800 Å is formed by an LPCVD method on the $SiO_2$ film 2.

Figure 2B:
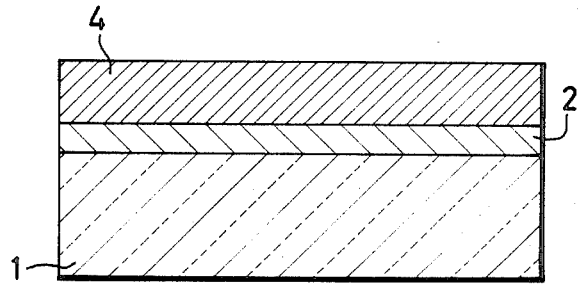

An electrically inactive impurity, i.e., $Si^+$ are implanted in the polysilicon film 3 at an acceleration energy of 40 keV and a dose of $1.5 \times 10^{15}$ cm$^{-2}$ to convert the polysilicon film 3 to an amorphous silicon film 4, as shown in FIG. 2B.

Figure 2C:
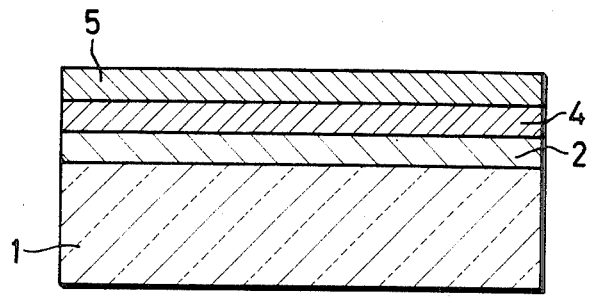

After the resultant structure is washed with an RCA cleaning liquid ($H_2O:H_2O_2:NH_3 = 7:2:1$), the amorphous silicon film 4 is lightly etched back by a predetermined etching solution ($H_2O:SO1 = 15:1$) to obtain a thin amorphous silicon film having a thickness of, e.g., 200 Å, as shown in FIG. 2C. Thereafter, an $SiO_2$ film 5 is deposited by the LPCVD method on the amorphous silicon film 4.

Figure 2D:
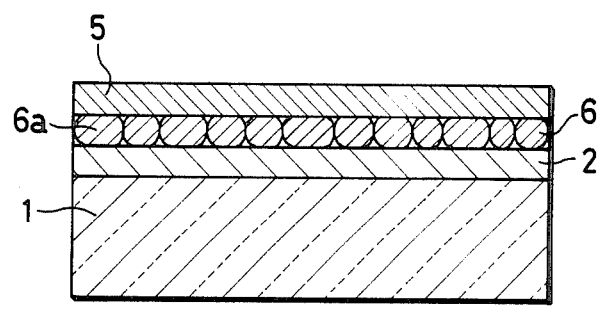

The resultant structure is annealed in an $N_2$ atmosphere at a temperature of, e.g., 1,000° C. for 100 hours. This annealing causes the solid-phase grain growth in the amorphous silicon film 4. As a result, a polysilicon film 6 is formed, as shown in FIG. 2D. The polysilicon film 6 has very large crystal grains 6a and a (100) orientation which has minimum surface energy. Thereafter, the $SiO_2$ film 5 is etched and removed.

Figure 2E:
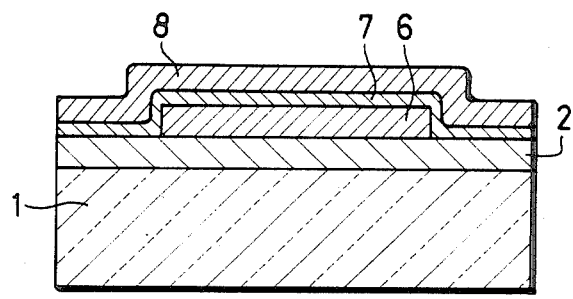

As shown in FIG. 2E, a predetermined portion of the polysilicon film 6 is etched to obtain a predetermined pattern. Thereafter, an $SiO_2$ film 7 and an impurity-doped polysilicon film (DOPOS film) 8 are sequentially deposited by the LPCVD method on the entire surface.

Figure 2F:
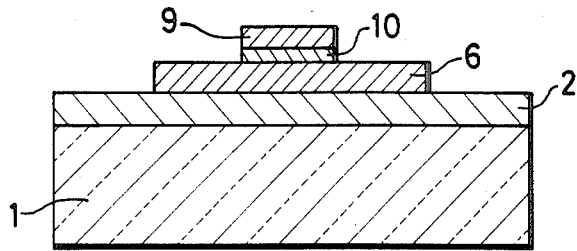

Predetermined portions of the DOPOS film 8 and the $SiO_2$ film 7 are sequentially etched to obtain a gate electrode 9 of a predetermined DOPOS pattern and a gate insulating film 10 of a predetermined $SiO_2$ pattern, as shown in FIG. 2F.

Figure 2G:
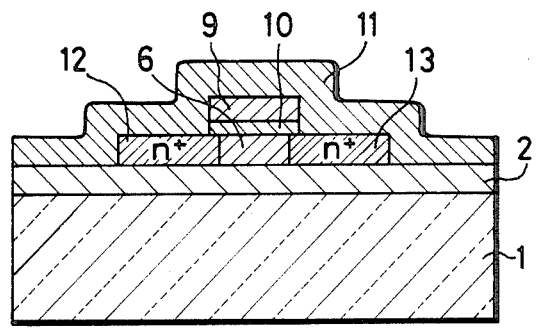

As shown in FIG. 2G, a phosphosilicate glass (PSG) film 11 is deposited to cover the entire surface. The PSG film 11 is annealed at a temperature of about 1,000° C. to diffuse phosphorus (P) atoms from the PSG film 11 to the polysilicon film 6, thereby forming an $n^+$-type source region 12 and an $n^+$-type drain region 13.

Figure 2H:
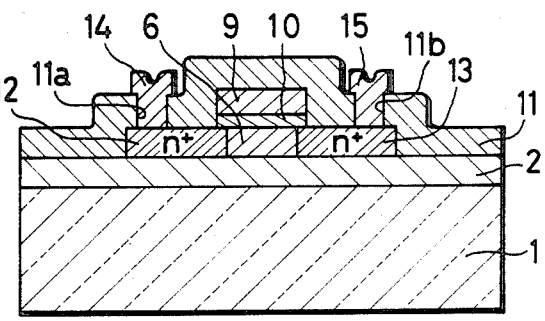

Thereafter, as shown in FIG. 2H, predetermined portions of the PSG film 11 are etched to form contact holes 11a and 11b. Aluminum electrode patterns 14 and 15 are formed through the contact holes 11a and 11b, respectively. As a result, an ultra-thin film polysilicon TFT is prepared.

According to the first embodiment, the polysilicon film 6 has a crystal grain size larger than the conventional size. The electron mobility $\mu$ of the TFT fabricated by using this polysilicon film 6 can be larger than that of the conventional TFT. Therefore, the TFT of the first embodiment has better electrical characteristics than those of the conventional TFT, so that application to an SOI can be achieved. Furthermore, in addition to the large crystal grain size, the orientation of the crystal grains in the polysilicon film 6 of this embodiment is more uniform than that of the polysilicon film formed by the conventional method, so that the resultant polysilicon film 6 can be similar to a monocrystalline silicon film. The size and orientation of the crystal grains of the large polysilicon film 6 formed by the above embodiment are substantially uniform throughout its surface and can be easily controlled, thereby simplifying the device design.

A second embodiment of the present invention will be described hereinafter.

Figure 3A:
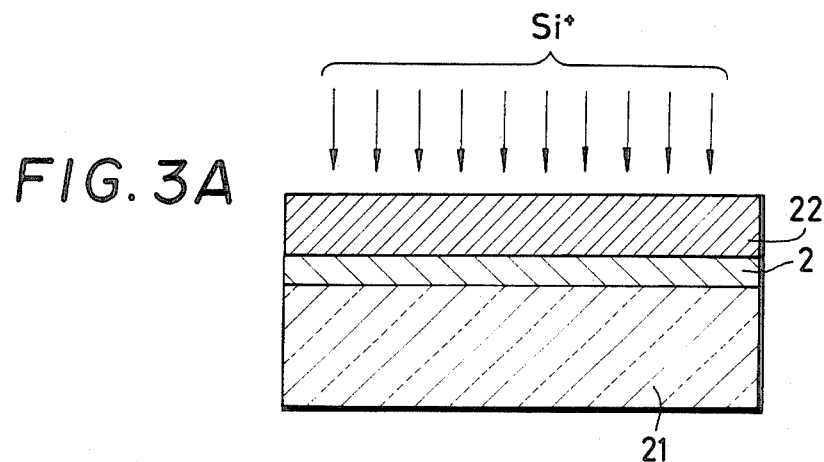
FIG. 3A to 3F are sectional views for explaining the steps in manufacturing an ultra-thin film polysilicon TFT by a method of forming a thin semiconductor film according to a second embodiment of the present invention.

As shown in FIG. 3A, an $SiO_2$ film 2 is formed on a glass substrate 21 such as TENPAX, PYREX or NA-40 (all are trade names) having a low melting point. A hydrogenated amorphous silicon film 22 having a thickness of, e.g., 800 Å is formed on the $SiO_2$ film 2 by a glow discharge decomposition method using an $SiH_4$ gas (an $SiH_4$ concentration is 10%) diluted with Ar gas and a 13.56-MHz RF voltage at a substrate temperature of 180° C.

Electrically inactive ions such as $Si^+$ or $F^+$ are implanted in the hydrogenated amorphous silicon film 22 at an acceleration energy of 40 keV (projected range $R_p \approx 550$ Å) and a dose of $1.5 \times 10^{15}$ cm$^{-2}$, so that the hydrogenated amorphous silicon film 22 is converted to be substantially amorphous.

Figure 3B:
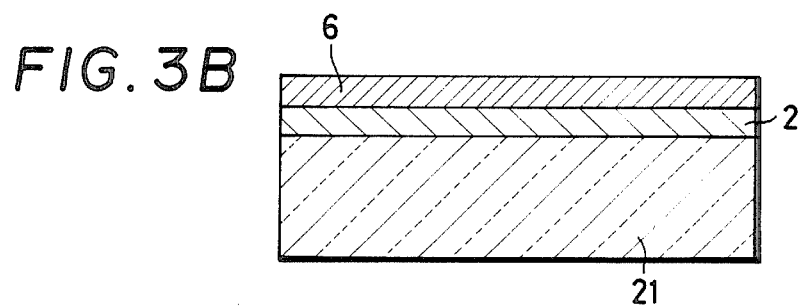

After the thickness of the amorphous silicon film 22 is decreased to a thickness of, e.g., about 200 Å in the same manner as in the first embodiment, the resultant structure is annealed in an $N_2$ atmosphere in an annealing furnace at a temperature of, e.g., 600° C. for about 15 hours. This annealing causes the solid-phase grain growth of the hydrogenated amorphous silicon film 22. As a result, the polysilicon film 6 is formed, as shown in FIG. 3B.

Figure 3C:
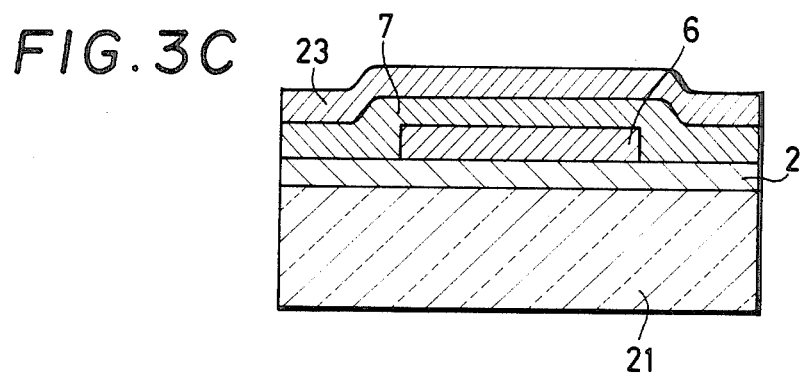

As shown in FIG. 3C, a predetermined portion of the polysilicon film 6 is etched to obtain a predetermined pattern. An $SiO_2$ film 7 is deposited by the LPCVD method to cover the entire surface. Subsequently, an Mo film 23 is formed by a sputtering method on the surface of the $SiO_2$ film 7.

Figure 3D:
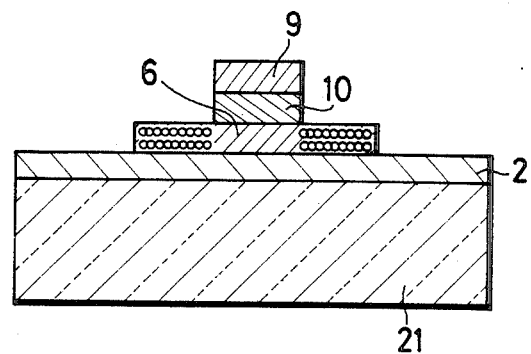

Predetermined portions of the Mo film 23 and the $SiO_2$ film 7 are sequentially etched to obtain a gate electrode 9 of a predetermined Mo pattern and a gate insulating film 10 of a predetermined $SiO_2$ pattern, as shown in FIG. 3D. Thereafter, by using the gate electrode 9 and the gate insulating film 10 as masks, $P^+$ ions are implanted in the polysilicon film 6 (P atoms in the polysilicon film 6 are represented by the hollow dots).

Figure 3E:
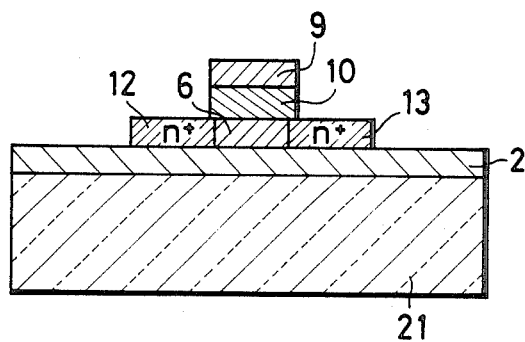

As shown in FIG. 3E, annealing is performed at a temperature of, e.g., 600° C. to electrically activate the P atoms to form an $n^+$-type source region 12 and an $n^+$-type drain region 13.

Figure 3F:
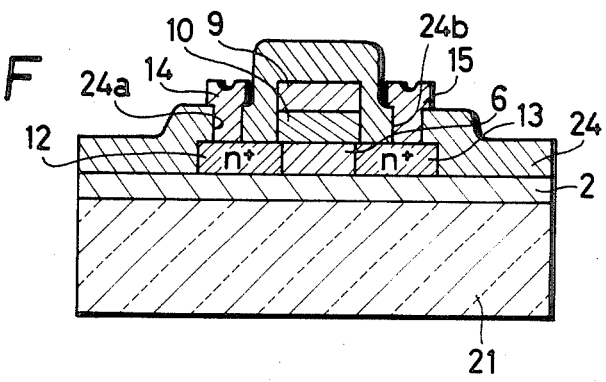

Thereafter, as shown in FIG. 3F, an $SiO_2$ film 24 as a passivation film is formed, and predetermined portions of the $SiO_2$ film 24 are etched to form contact holes 24a and 24b. Aluminum electrode patterns 14 and 15 are formed through the contact holes 24a and 24b, thereby preparing an ultra-thin film polysilicon TFT.

FIG. 4 shows reflection spectra measured for the hydrogenated amorphous silicon film 22 immediately after deposition (curve A), the hydrogenated amorphous silicon film 22 immediately after $Si^+$ ion implantation (curve B), the hydrogenated amorphous silicon film 22 after $Si^+$ implantation and annealing at a temperature of 600° C. for 15 hours (i.e., the polysilicon film 6) (curve D) in the second embodiment. A reflection spectrum of the hydrogenated amorphous silicon film 22 after 15-hour annealing at 600° C. without $Si^+$ ion implantation (curve C) is also plotted in FIG. 4.

As is apparent from FIG. 4, an absorption peak (indicating crystallization) of silicon at a wavelength $\lambda = 280$ nm due to an $X_1$-$X_4$ band transition is present on only the curve D, but not on the curve C. For this reason, it is found that the polysilicon film is obtained only when the ion implantation of $Si^+$ or the like and then annealing are sequentially performed after the hydrogenated amorphous silicon film 22 is formed as described in the second embodiment.

Figure 5:
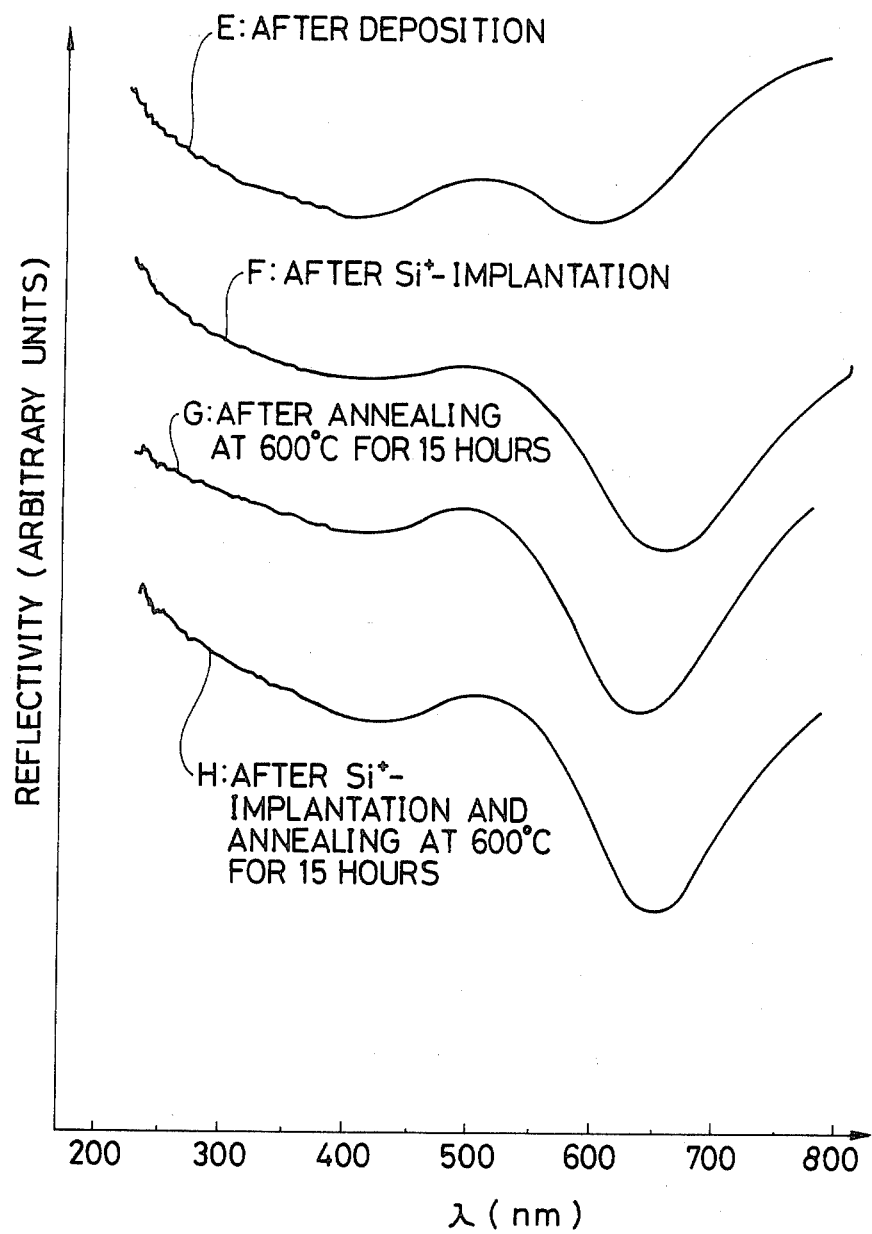
FIG. 5 is a graph, similar to the graph of FIG. 4, showing reflection spectra of an amorphous silicon film formed by a deposition method after various treatments are performed.

The reflection spectra of the amorphous silicon film which does not contain hydrogen and is formed by a deposition method using an electron gun at a substrate temperature of 150° C. are illustrated in FIG. 5 in the same manner as in FIG. 4. As is apparent from FIG. 5, no absorption peak at a wavelength $\lambda = 280$ nm due to the $X_1$-$X_4$ band transition exists in curves E to H. Therefore, the crystal grain growth effect is not substantially obtained in the amorphous silicon film which does not contain hydrogen and formed by the above-mentioned deposition method.

Figure 6:
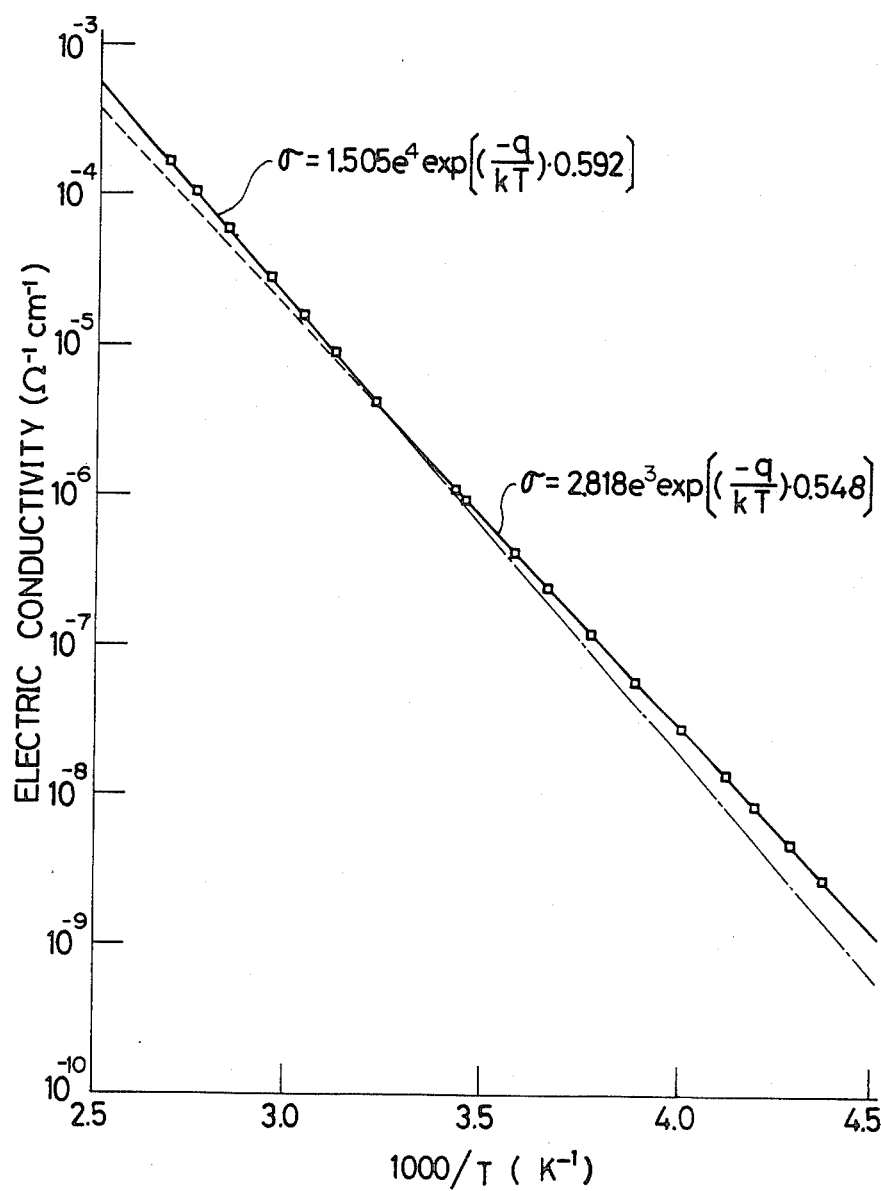
FIG. 6 is a graph showing the electric conductivity of a polysilicon film formed in the second embodiment as a function of temperature.

The elastic conductivity $\sigma$ of the polysilicon film 6 formed as described above as a function of temperature is illustrated in FIG. 6. As is apparent from FIG. 6, a polygonal line appears in the graph showing the electric conductivity $\sigma$ as a function of temperature. The electric conductivity $\sigma$ of the polysilicon film 6 at room temperature or higher is given by:

$$\sigma = 1.505 e^4 \exp((-q/kT) \cdot 0.592)$$

However, the electric conductivity $\sigma$ of the polysilicon film 6 below room temperature is given by:

$$\sigma = 2.818 e^3 \exp((-q/kT) \cdot 0.548)$$

Although the polysilicon film 6 has different electric conductivities depending on different temperatures (i.e., activation energy levels are different), activation type electric conductivities can be obtained. Therefore, the electrical characteristics of the polysilicon film 6 are far better than those of the conventional polysilicon film.

According to the second embodiment, the polysilicon film 6 with good electrical characteristics can be formed on the glass substrate 21 having a low melting point. The hydrogenated amorphous silicon film 22 is formed, $Si^+$ ions are implanted, and then annealing is performed to achieve solid-phase grain growth, thereby obtaining the large and uniform polysilicon film 24. Therefore, the TFT of the second embodiment which employs the polysilicon film 6 has a high electron mobility $\mu$ and a small leakage current. When a TFT array is formed on a single substrate, the TFTs can have identical electrical characteristics.

The method of forming the polysilicon film in the second embodimnt can also be applied to formation of a polysilicon film as a wiring material or a gate material of a MOS transistor and to the above-mentioned SOI for forming a crystallized silicon layer on an insulating substrate.

The mechanism according to which the polysilicon film 6 with good electrical characteristics is formed has not been sufficiently clarified but can be assumed as follows. $Si^+$ ions are implanted in the hydrogenated amorphous silicon film 22 formed by the glow discharge decomposition method to change the network structure of silicon atoms in the hydrogenated amorphous silicon film 22, thereby obtaining an amorphous state different from that immediately after film formation. As a results, activation energy required for crystallization is decreased to obtain advantageous nucleus growth conditions during the solid-phase grain growth by annealing.

The present invention is exemplified by the two embodiments described above, but is not limited thereto. Various changes and modifications may be made within the scope and spirit of the present invention. In the first embodiment, wet etching using a solution mixture of $H_2O$ and SO1 is performed to decrease the thickness of the amorphous silicon film 4. However, wet etching using a KOH solution or hot phosphoric acid can be performed. Dry etching such as reactive ion etching (RIE) can also be used for this purpose. Furthermore, the amorphous silicon film 4 can be thermally oxidized to decrease its thickness. For example, in order to obtain an amorphous silicon film 4 having a thickness of 200 Å in the first embodiment, thermal oxidation can be performed at a temperature of 1,000° C. for 150 minutes. The thickness of the amorphous silicon film 4 is preferably 300 Å or less so as to increase dependency on surface energy during annealing, thereby increasing the crystal grain size and improving orientation of the crystal grains.

In the first embodiment, the polysilicon film 6 has the (100) orientation. However, in order to obtain a polysilicon film 6 having the (111) orientation, annealing is performing without forming the $SiO_2$ film 5 on the amorphous silicon film 4. When the $SiO_2$ film 5 is not formed, the surface energy is minimized with the (111) orientation. When the thickness of the amorphous silicon film 4 is decreased by the thermal oxidation method described above, annealing is performed while the $SiO_2$ film is formed on the surface of the amorphous silicon film 4, thereby obtaining a polysilicon film 6 having the (100) orientation. However, when annealing is performed after the $SiO_2$ film 6 is etched, a polysilicon film 6 having the (111) orientation can be obtained.

In the first embodiment, an annealing temperature for solid-phase grain growth is not limited to 1,000° C., but can be changed in accordance with the type of substrate. Ion species for converting the polysilicon film 3 to an amorphous film are not limited to $Si^+$ and $F^+$, but can be extended to other species as needed. The dose of the ions varies in combination with the annealing temperature but preferably falls within the range between $5 \times 10^{14}$ to $1 \times 10^{16}$ cm$^{-2}$. The dose of $5 \times 10^{14}$ cm$^{-2}$ is most preferable for an annealing temperature of 600° C. and an annealing time of 15 hours. The substrate is not limited to a quartz substrate, but can be extended to other substrates. For example, a silicon substrate can be used.

In the second embodiment, hydrogen-containing amorphous silicon film is formed by the glow discharge decompositon method. However, a light-CVD or sputtering method using SiH$_4$ gas can be utilized. PH$_3$ or B$_2$H$_6$ gas can be added to SiH$_4$ gas in the above-mentioned glow discharge decomposition method or the light-CVD method to obtain an impurity-doped amorphous silicon film. Similarly, an impurity-containing composite target can be used by the sputtering method to form an impurity-doped amorphous silicon film. It should be noted that solid-phase grain growth can be easily performed when impurities such as B or P are contained in the amorphous silicon film.

Furthermore, the hydrogenated amorphous silicon film 22 is subjected to solid-phase grain growth by annealing to form the polysilicon film 6. Thereafter, an Si$_3$N$_4$ film having a thickness of, e.g., 5,000 Å is formed by a plasma CVD method on the polysilicon film 6 at a substrate temperature of about 260° C. The resultant structure is annealed at a temperature of 400° C. for about 1 hour, so that hydrogen is doped from the Si$_3$N$_4$ film to the polysilicon film 6 and fills the trap to decrease the trap density at the crystal grain boundaries, thereby obtaining a polysilicon film with better electrical characteristics.

In the second embodiment described above, annealing is performd for solid-phase grain growth in the annealing surface. However, heating can be performed by a lamp. Furthermore, for example, when hydrogen plasma annealing is performed at a temperature of about 450° C. for several hours, a polysilicon film 6 containing a sufficient amount of hydrogen and having excellent electrical characteristics can be obtained. The annealing temperature varies in accordance with the type of substrate. In order to prevent hydrogen from being emitted outside the film during annealing and to achieve low-temperature process, the annealing temperature is preferably 600° C. or less.

Ion implantation of Si$^+$ and the like for converting the polysilicon film to an amorphous film can be performed under conditions different from those of the above embodiments. The substrate is not limited to a glass substrate, but can be extended to other substrates such as quartz substrate.

What is claimed is:

1. A method of forming a thin semiconductor film, comprising the steps of: forming a thin semiconductor film on a predetermined substrate; implanting predetermined dopant ions in said thin semiconductor film to convert said thin semiconductor film to a thin amorphous semiconductor film; decreasing the thickness of said thin amorphous semiconductor film to a predetermined thickness; and annealing said thin amorphous semiconductor film to cause a solid-phase growth.

2. A method according to claim 1, wherein said thin semiconductor film contains hydrogen.

3. A method according to claim 1 or 2, wherein said thin semiconductor film comprises a polysilicon film.

4. A method according to claim 2, wherein said thin semiconductor film comprises an amorphous silicon film.

5. A method according to any one of claims 1 to 4, wherein said thin amorphous semiconductor film after decreasing the thickness has a thickness of not more than 300 Å.

* * * * *